United States Patent
Tanaka

[19]

[11] Patent Number: 5,946,577
[45] Date of Patent: Aug. 31, 1999

[54] METHOD OF MANUFACTURING SEMICONDUCTOR DEVICE

[75] Inventor: Takao Tanaka, Tokyo, Japan

[73] Assignee: NEC Corporation, Japan

[21] Appl. No.: 08/900,615

[22] Filed: Jul. 25, 1997

[30] Foreign Application Priority Data

Jul. 26, 1996 [JP] Japan .................................. 8-197530

[51] Int. Cl.[6] .................................................. H01L 21/336
[52] U.S. Cl. ........................... 438/297; 438/449; 438/298
[58] Field of Search .................................. 438/297, 298, 438/444, 447, 449, 275

[56] References Cited

U.S. PATENT DOCUMENTS

| | | | |
|---|---|---|---|
| 5,418,176 | 5/1995 | Yang et al. | ................................ 437/52 |
| 5,422,300 | 6/1995 | Pfiester et al. | ............................. 437/70 |

FOREIGN PATENT DOCUMENTS

| | | |
|---|---|---|
| 59-8350 | 1/1984 | Japan . |
| 62-76533 | 4/1987 | Japan . |
| 5-259410 | 10/1993 | Japan . |
| 7-94603 | 4/1995 | Japan . |
| 10-74847 | 3/1998 | Japan . |

OTHER PUBLICATIONS

Japanese Patent Office Action Dated Nov. 17, 1998 Along with a Translation of Same.

*Primary Examiner*—Joni Chang

[57] ABSTRACT

In a method of manufacturing a semiconductor device, a first oxide film is formed on a semiconductor substrate of the first conductivity type by using, as a mask, an oxidation preventing film formed in an element formation region. The oxidation preventing film is selectively etched and removed by using a patterned resist as a mask, thereby exposing the surface of the semiconductor substrate. An impurity of the second conductivity type is implanted in an exposed portion of the semiconductor device by using the resist as a mask, thereby forming an impurity diffusion layer of the second conductivity type. Thermal oxidation is performed while leaving the oxidation preventing film after the resist is removed, thereby forming a second oxidation film having a predetermined thickness on the surface of the impurity diffusion layer. Thermal oxidation is performed after the oxidation preventing film is removed, thereby forming a third thin oxide film on the surface of the semiconductor substrate.

10 Claims, 3 Drawing Sheets

METHOD OF MANUFACTURING SEMICONDUCTOR DEVICE

BACKGROUND OF THE INVENTION

The present invention relates to a method of manufacturing a semiconductor device and, more particularly, to a method of manufacturing a semiconductor device in which a thin oxide film is formed adjacent to a thick oxide film formed on an impurity diffusion layer, like a flat-cell ROM (Read Only Memory).

FIGS. 3A to 3D show some steps of a method of manufacturing a conventional flat-cell ROM. As shown in FIG. 3A, after an oxide film 12 and a nitride film 13 are sequentially formed on the surface of a p-type semiconductor substrate 11, the nitride film 13 and the oxide film 12 in a region except for an element formation region are removed by RIE (Reactive Ion Etching) or the like using a photoresist mask. Element isolation oxide films 14 are formed by LOCOS (LOCal Oxidation of Silicon) on the surface of the semiconductor substrate 11 in the region except for the element formation region. As shown in FIG. 3B, the photoresist mask, the nitride film 13, and the oxide film 12 in the element formation region are sequentially removed by etching.

As shown in FIG. 3C, after thermal oxidation is performed again to form an oxide film 20 on the surface of the semiconductor substrate 11 in the element formation region surrounded by the element isolation oxide films 14, arsenic is ion-implanted in the surface of the semiconductor substrate 11 by using a photoresist mask 15 having openings at predetermined portions, thereby forming buried $n^+$-type layers 16. Then, a p- or n-type well is formed by photolithography and ion implantation. FIG. 3D shows a state wherein a p-type well 18 is formed. The oxide film 20 is removed by etching, and heat treatment is performed to form gate oxide films 19 on the p-type well 18. Since the dose is high in the region of the buried $n^+$-type layer 16, oxide films having a high growth rate, i.e., enhanced oxide films 17 are formed at the same time as the gate oxide films 19.

Assume that arsenic ion implantation conditions are 50 to 100 keV and a dose of 5E14 to 5E15 $cm^{-2}$, and the gate oxide film 19 having a thickness of about 150 Å is formed by steam oxidation at 850° as a gate oxidation condition. In this case, the enhanced oxide film 17 on the buried $n^+$-type layer 16 has a thickness of about 300 Å. Therefore, if the gate oxide film 19 is formed to a thickness of 100 Å or less along with micropatterning of an element, the thickness of the enhanced oxide film 17 is decreased to 200 Å or less.

In this manner, according to the conventional manufacturing method, since the gate oxide film 19 and the enhanced oxide film 17 are simultaneously formed, the thickness of the enhanced oxide film 17 decreases along with a decrease in thickness of the gate oxide film 19. As a result, inconvenience occurs when the buried $n^+$-type layer 16 is aligned by using the enhanced oxide film 17 as an alignment mark in the subsequent step. That is, a step on the substrate surface which is formed at the end portion of the enhanced oxide film 17 formed thick is generally used as an alignment mark. However, if the step on the substrate surface is relaxed due to the decrease in thickness of the gate oxide film 19, the alignment accuracy decreases or alignment fails when alignment is performed by detecting the step by laser scanning.

In the conventional manufacturing method, the oxidation time required for forming the gate oxide film 19 to a predetermined thickness is relatively long, and the buried $n^+$-type layer 16 is exposed on the substrate surface. At this time, since the ion implantation dose is as relatively high as 5E14 to 5E15 $cm^{-2}$, a gate oxidation furnace is contaminated by out-diffusion of an $n^+$-type impurity.

SUMMARY OF THE INVENTION

It is an object of the present invention to provide a method of manufacturing a semiconductor device in which a gate oxide film and an enhanced oxide film can be formed to desired thicknesses.

It is another object of the present invention to provide a method of manufacturing a semiconductor device in which out-diffusion of an impurity is suppressed.

In order to achieve the above objects, according to the present invention, there is provided a method of manufacturing a semiconductor device, comprising the steps of forming a first oxide film on a semiconductor substrate of a first conductivity type by using, as a mask, an oxidation preventing film formed in an element formation region, selectively etching and removing the oxidation preventing film by using a patterned resist as a mask, thereby exposing a surface of the semiconductor substrate, implanting an impurity of a second conductivity type in an exposed portion of the semiconductor device by using the resist as a mask, thereby forming an impurity diffusion layer of the second conductivity type, performing thermal oxidation while leaving the oxidation preventing film after the resist is removed, thereby forming a second oxidation film having a predetermined thickness on a surface of the impurity diffusion layer, and performing thermal oxidation after the oxidation preventing film is removed, thereby forming a third thin oxide film on the surface of the semiconductor substrate.

DESCRIPTION OF THE PREFERRED EMBODIMENTS

The present invention will be described in detail below with reference to the accompanying drawings.

Figure 1A:
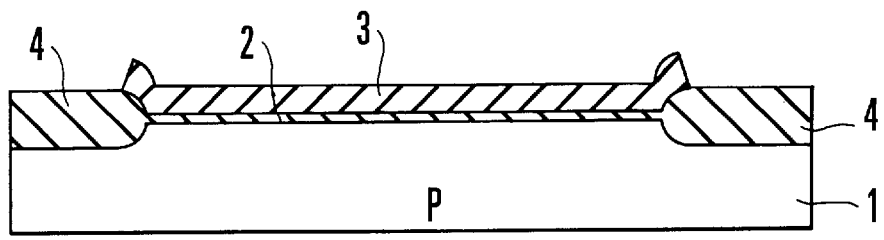
FIGS. 1A to 1D are sectional views, respectively, showing a method of manufacturing a semiconductor device according to the first embodiment of the present invention.

FIGS. 1A to 1D show a method of manufacturing a semiconductor device according to the first embodiment of the present invention. The manufacture of a flat-cell ROM will be exemplified. As shown in FIG. 1A, a thin oxide film 2 and a nitride film 3 are sequentially formed on the surface of a p-type semiconductor substrate 1. A patterned photoresist is used as a mask to etch and remove the nitride film 3 and the oxide film 2 at the opening portion of the resist formed in a region except for an element formation region. At this time, the nitride film 3 functions as an oxidation preventing film. Element isolation oxide films 4 are formed by thermal oxidation using LOCOS on the surface of the semiconductor substrate 1 in the region except for the element formation region of the thick film.

Figure 1B:
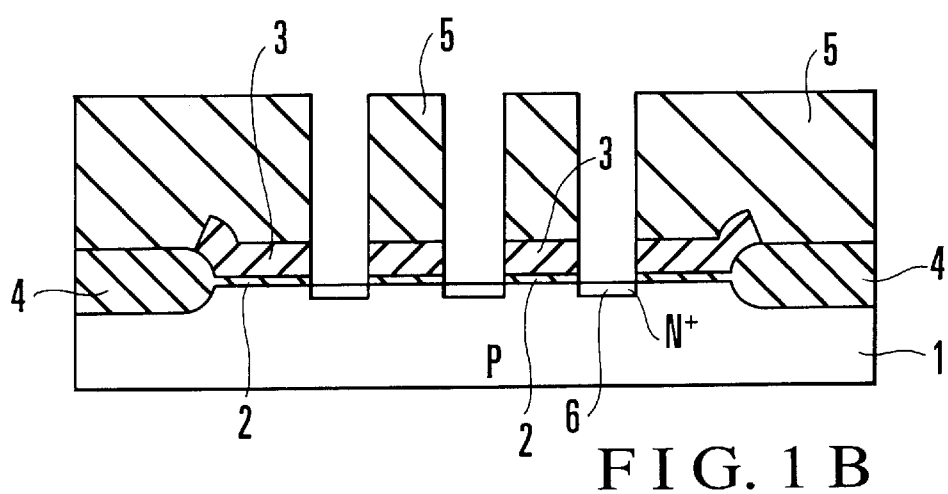

As shown in FIG. 1B, after a photoresist 5 is applied on the nitride film 3 and the element isolation oxide films 4, the photoresist 5 in the element formation region is patterned. Using the patterned photoresist 5 as a mask, the nitride film 3 and the oxide film 2 are selectively removed by etching to expose the semiconductor substrate 1. Then, using the photoresist 5 as a mask, an n-type impurity is ion-implanted in the exposed surface of the semiconductor substrate 1 to form buried n$^+$-type layers 6. In this case, the n-type impurity ion-implantation conditions are, e.g., an arsenic dopant, an energy of 50 keV to 100 keV, and a dose of $5 \times 10^{14}$ cm$^{-2}$ to $5 \times 10^{15}$ cm$^{-2}$.

Figure 1C:
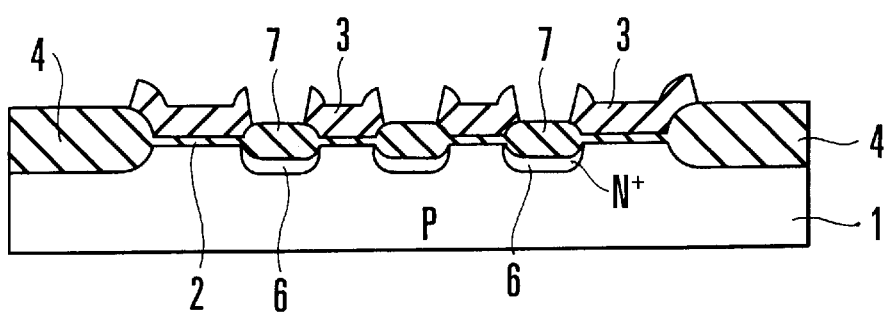

As shown in FIG. 1C, after the photoresist 5 is removed, thermal oxidation is performed in a nitrogen atmosphere at a temperature of 800 to 900° C. for 10 to 60 min in order to activate the ion-implanted n-type impurity. Further, thermal oxidation is performed in a steam atmosphere at a temperature of 800 to 900° C. while leaving the nitride film 3, thereby forming thermal oxide films 7 having a thickness of about 500 to 1,500 Å on the buried n$^+$-type layers 6. At this time, the nitride film 3 functions as an oxidation preventing film.

Figure 1D:
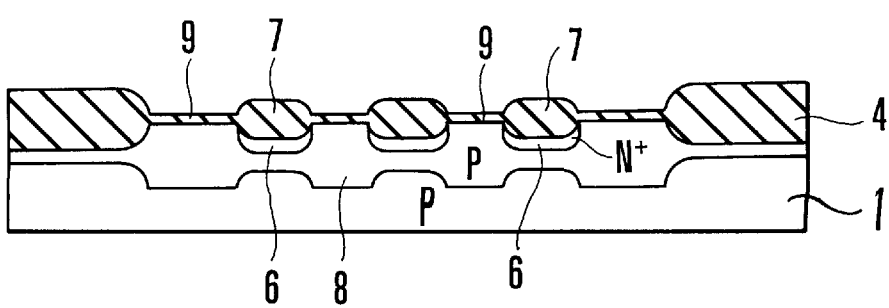

As shown in FIG. 1D, all the nitride film 3 and the oxide film 2 in the element formation region are removed by etching. A p- or n-type well is formed by well formation photolithography and ion implantation. FIG. 1D shows a state wherein a p-type well 8 is formed. Then, thermal oxidation is performed in a steam atmosphere at a temperature of 700 to 900° C. to form gate oxide films 9 having a thickness of 100 to 200 Å on the p-type well 8. A gate electrode, an interlayer insulating film, a metal interconnection, and a passivation film (none of them are shown) are sequentially formed to complete a flat-cell ROM.

In this manufacturing method, since the enhanced oxide film 7 on the buried n$^+$-type layer 6, and the gate oxide film 9 are formed in independent steps, their film thicknesses can be properly controlled. If the enhanced oxide film 7 is formed thick, the alignment accuracy with respect to the buried n$^+$-type layer 6 can be increased in the subsequent photolithography step using a step. If the enhanced oxide film 7 is formed thick, the parasitic capacitance between the buried n$^+$-type layer 6 and a gate electrode to be formed on the buried n$^+$-type layer 6 in the subsequent step can be reduced to increase the operation speed of the semiconductor device. Since thermal oxidation for forming the gate oxide film 9 is performed while the buried n$^+$-type layer 6 is covered by forming the enhanced oxide film 7 on the buried n$^+$-type layer 6, out-diffusion of a high-concentration n-type impurity can be suppressed to prevent contamination of a gate oxidation furnace. Since the buried n$^+$-type layer 6 and the enhanced oxide film 7 are formed directly using the nitride film 3 which prevents oxidation in forming the element isolation oxide film 4, no additional photolithography step is required.

Figure 2A:
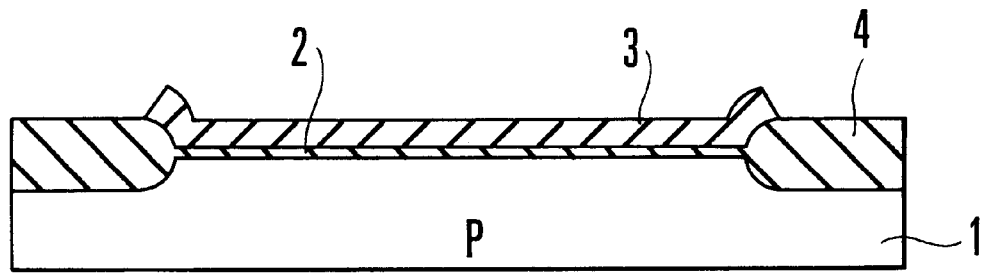
FIGS. 2A to 2C are sectional views, respectively, showing a method of manufacturing a semiconductor device according to the second embodiment of the present invention.
Figure 2B:
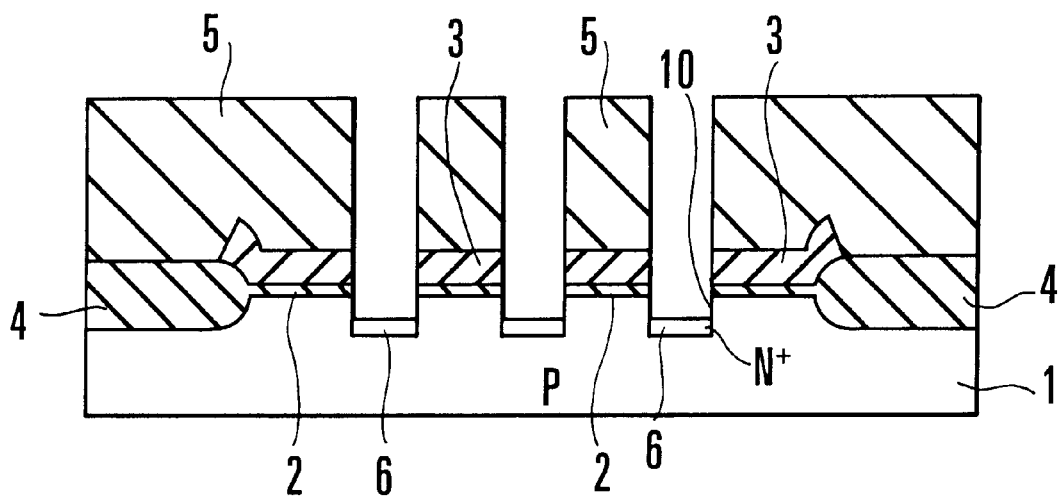

The second embodiment of the present invention will be described with reference to FIGS. 2A to 2C. As shown in FIG. 2A, element isolation oxide films 4 are formed by LOCOS on the surface of a p-type semiconductor substrate 1 in a region except for an element formation region, similar to FIG. 1A. As shown in FIG. 2B, a patterned photoresist 5 is used as a mask to selectively etch a nitride film 3 and an oxide film 2 at the opening portion of the resist by using RIE or the like. At the same time, the surface of the semiconductor substrate 1 is etched to form a groove having a depth of about 200 to 500 Å. An n-type impurity is ion-implanted directly using the photoresist 5 as a mask to form buried n$^+$-type layers 6 in regions wherein the semiconductor substrate 1 is exposed.

Figure 2C:
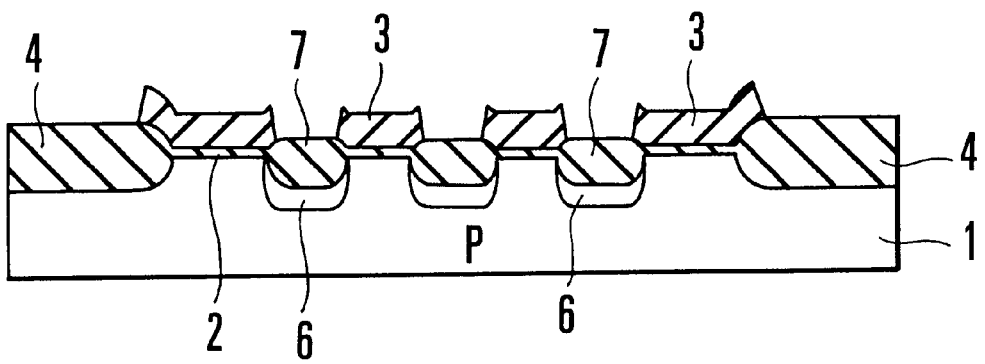
Figure 3:
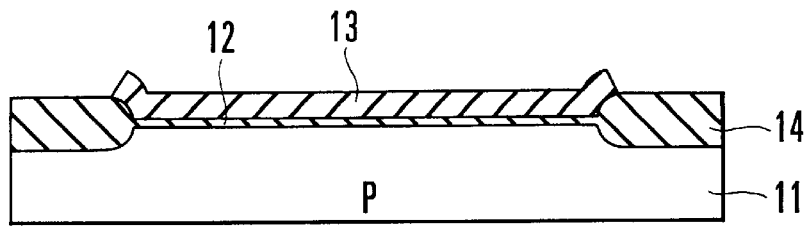
FIGS. 3A to 3D are sectional views, respectively, showing a method of manufacturing a conventional semiconductor device.
Figure 3:
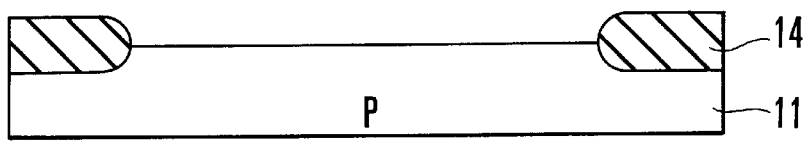
Figure 3:
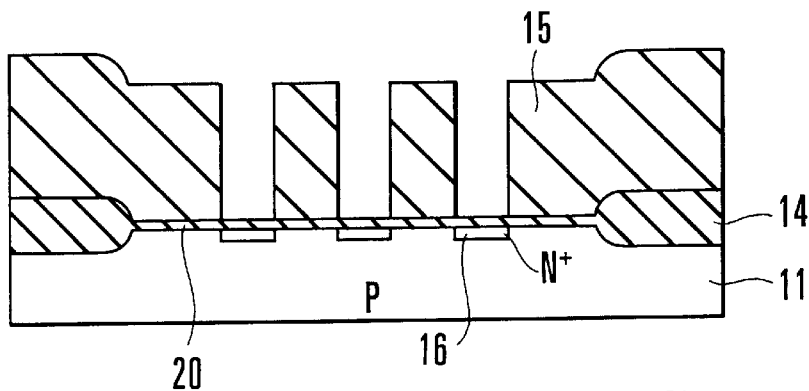
Figure 3:
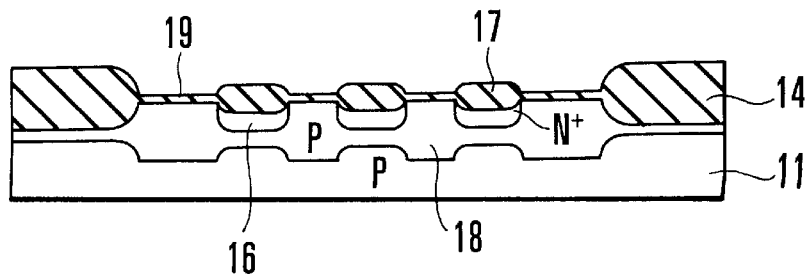

As shown in FIG. 2C, after the photoresist 5 is removed, thermal oxidation is performed in a nitrogen atmosphere to activate the ion-implanted n-type impurity. Thermal oxidation is performed in a steam atmosphere at 800 to 900° C. while leaving the nitride film 3, thereby forming enhanced oxide films 7 on the buried n$^+$-type layers 6.

The subsequent manufacturing process is the same as in the first embodiment. As shown in FIG. 1D, after the nitride film 3 and the oxide film 2 are removed by etching, a p-type well 8 is formed, and gate oxide films 9 are formed by thermal oxidation.

In the second embodiment, since a groove 10 is formed before forming the buried n$^+$-type layer 6, it can be used as a pattern step necessary for mask alignment with respect to the buried n$^+$-type layer 6 in a step before forming the enhanced oxide film 7. Even when the enhanced oxide film 7 is formed sufficiently thick, its surface portion projecting from the surface of the semiconductor substrate 1 can be made low. Therefore, the parasitic capacitance with respect to the gate electrode can be decreased, and the flatness of the element formation region can be improved.

Each embodiment has exemplified the case wherein the present invention is applied to the flat-cell ROM. However, the manufacturing method of the present invention can be applied to a semiconductor device in which a thick oxide film is formed on a buried diffusion layer formed in a semiconductor substrate, and a thin oxide film is formed in a region adjacent thereto.

As has been described above, according to the present invention, a decrease in alignment accuracy with respect to an impurity diffusion layer of the second conductivity type in the subsequent photolithography step can be prevented. In addition, the parasitic capacitance between the impurity diffusion layer and a conductive layer formed thereon can be decreased. This is because the second and third oxide films are independently formed on the impurity diffusion layer of the second conductivity type, so that the second oxide film can be formed thick necessary for alignment.

Contamination of the gate oxidation furnace by the impurity diffusion layer of the second conductivity type can be prevented. This is because the third oxide film is formed while the surface of the impurity diffusion layer of the second conductivity type is covered with the second oxide film, so that out-diffusion of the impurity of the second conductivity type can be suppressed.

Further, the semiconductor device can be manufactured without adding any photolithography step to the conventional process. This is because the groove, the impurity diffusion layer of the second conductivity type, and the second oxide film can be formed directly using an oxidation preventing film for forming the first oxide film.

What is claimed is:

1. A method of manufacturing a semiconductor device, comprising the steps of:

forming a first oxide film on a semiconductor substrate of a first conductivity type by using, as a mask, an oxidation preventing film formed in an element formation region;

selectively etching and removing said oxidation preventing film by using a patterned resist as a mask, thereby exposing a surface of said semiconductor substrate;

implanting an impurity of a second conductivity type in an exposed portion of said semiconductor device by using said resist as a mask, thereby forming an impurity diffusion layer of the second conductivity type;

performing thermal oxidation while leaving said oxidation preventing film after said resist is removed, thereby forming a second oxidation film having a thickness on a surface of said impurity diffusion layer; and performing thermal oxidation after said oxidation preventing film is removed, thereby forming a third thin oxide film on said surface of said semiconductor substrate.

2. A method according to claim 1, wherein the step of forming said second oxide film comprises the step of performing thermal oxidation after said resist is removed, thereby activating the ion-implanted impurity.

3. A method according to claim 1, wherein the step of forming said third oxide film comprises the steps of:

forming a well of one of the first and second conductivity types in the element formation region after said oxidation preventing film is removed; and forming said third oxide film by thermal oxidation on a surface of said well except for said second oxide film.

4. A method according to claim 1, wherein said second oxide film is formed to a thickness of 500 to 1,500 Å, and said third oxide film is formed to a thickness of 100 to 200 Å.

5. A method according to claim 1, wherein said semiconductor device is a flat-cell ROM, said first oxide film constitutes an element isolation oxide film, said second oxide film forms an alignment step on said surface of said semiconductor substrate, and said third oxide film constitutes a gate oxide film.

6. A method of manufacturing a semiconductor device, comprising the steps of:

forming a first oxide film on a semiconductor substrate of a first conductivity type by using, as a mask, an oxidation preventing film formed in an element formation region;

selectively etching and removing said oxidation preventing film and said semiconductor substrate by using a patterned resist as a mask, thereby forming a groove in a surface of said semiconductor substrate;

implanting an impurity of a second conductivity type by using said resist as a mask, thereby forming an impurity diffusion layer of the second conductivity type on a bottom surface of the groove;

performing thermal oxidation while leaving said oxidation preventing film after said resist is removed, thereby forming a second oxide film having a thickness on said impurity diffusion layer; and performing thermal oxidation after said oxidation preventing film is removed, thereby forming a third thin oxide film on said surface of said semiconductor device.

7. A method according to claim 6, wherein the step of forming said second oxide film comprises the step of performing thermal oxidation after said resist is removed, thereby activating the ion-implanted impurity.

8. A method according to claim 6, wherein the step of forming said third oxide film comprises the steps of:

forming a well of one of the first and second conductivity types in the element formation region after said oxidation preventing film is removed; and forming said third oxide film by thermal oxidation on a surface of said well except for said second oxide film.

9. A method according to claim 6, wherein said second oxide film is formed to a thickness of 500 to 1,500 Å, and said third oxide film is formed to a thickness of 100 to 200 Å.

10. A method according to claim 6, wherein said semiconductor device is a flat-cell ROM, said first oxide film constitutes an element isolation oxide film, said second oxide film forms an alignment step on said surface of said semiconductor substrate, and said third oxide film constitutes a gate oxide film.

* * * * *